US 6,661,204 B2

(12) United States Patent
Malcolm

(10) Patent No.: US 6,661,204 B2
(45) Date of Patent: Dec. 9, 2003

(54) BATTERY CHARGE MONITOR

(75) Inventor: John Stuart Malcolm, Headley (GB)

(73) Assignee: Dialog Semiconductor GmbH, Kirchheim/Teck-Nabern (DE)

( * ) Notice: Subject to any disclaimer, the term of this patent is extended or adjusted under 35 U.S.C. 154(b) by 125 days.

(21) Appl. No.: 10/094,453

(22) Filed: Mar. 8, 2002

(65) Prior Publication Data

US 2003/0169020 A1 Sep. 11, 2003

(51) Int. Cl.[7] .................................................. H02J 7/00
(52) U.S. Cl. ...................................................... 320/136
(58) Field of Search ................................ 320/136, 132, 320/130, 152, 156; 324/428, 429, 430; 340/636; 307/30, 38, 126, 112

(56) References Cited

U.S. PATENT DOCUMENTS

| | | | |
|---|---|---|---|
| 3,917,928 A | 11/1975 | Wesner | 235/92 CA |
| 5,870,685 A | 2/1999 | Flynn | 455/573 |
| 6,046,574 A | 4/2000 | Baranowski et al. | 320/132 |
| 6,157,170 A * | 12/2000 | Noda et al. | 320/132 |
| 6,291,966 B1 | 9/2001 | Wendelrup et al. | 320/106 |
| 6,339,314 B1 * | 1/2002 | Bruning | 320/128 |
| 6,339,315 B1 * | 1/2002 | Castelli et al. | 320/136 |

FOREIGN PATENT DOCUMENTS

| | | | |
|---|---|---|---|
| EP | 0952456 A2 | 10/1999 | G01R/31/36 |
| EP | 1037065 A1 | 9/2000 | G01R/31/36 |

* cited by examiner

Primary Examiner—Edward H. Tso
Assistant Examiner—Pia Tibbits
(74) Attorney, Agent, or Firm—George O. Saile; Stephen B. Ackerman

(57) ABSTRACT

A method and a circuit to monitor exactly the charge status of a battery of a battery powered device is achieved. The charge and discharge currents are continuously measured and integrated over time to get the exact charge of the battery. Inaccuracies caused by the offset of the integrators are precisely compensated by a bridge-like design of said circuit and by a feedback of said offset to the input of the integrators. The system is clocked in a way to enable a continuous operation. Another advantage is the low current consumption of the circuit by sharing some of the components for the integration of the currents and handling of the offset. The improved accuracy is optimizing the operation of said battery driven device and is avoiding any potential damage of the battery.

41 Claims, 2 Drawing Sheets

BATTERY CHARGE MONITOR

BACKGROUND OF THE INVENTION

(1) Field of the Invention

The invention relates to a circuit and a method for battery power receiving devices, and more particularly, to a continuous measurement of the charge and discharge of a battery in battery powered appliances as e.g. mobile phones to improve the accuracy of said measurement and the related charge control while introducing a solution with low power consumption.

(2) Description of the Prior Art

In a battery powered mobile unit or device it is necessary to monitor the battery charge status including monitoring the energy flow both into and out of the battery so that either parts of the functions of the device or the total device can be properly shut down before the battery supply voltage drops below a threshold for acceptable operation of the unit or proper actions are initiated to recharge the battery before said threshold is reached. Proper shutdown often involves saving configuration parameters in a non-volatile memory and/or providing either the user or an electrical or mechanical device with proper warning prior to shutdown.

One approach includes simply monitoring the battery voltage. A problem associated with this approach, however, is that the battery voltage, when measured at a point beyond the battery terminals, depends upon the ohmic losses or the drop in voltage caused by a current passing through a resistive path. In addition, the battery itself includes some variable ohmic loss, which is dependent upon the amount of charge remaining in the battery and the current being drawn from the battery. For example, a fully charged battery might measure 4.2 V at the terminals under a very small load such as <1 mA, but measure 3.9 V under a load of 1 A. This voltage drop at the terminals is due to the output impedance of the battery. Thus, a half-discharged battery measuring 3.5 V at 1 mA might only provide 3.1 V under a 1A load. As example in a mobile phone having different modes as sleep, standby or transmit mode the load can vary significantly. A 3.4 V output voltage of a battery under "light" load conditions as standby or sleep requiring 10 mA may drop to 3.0 V under a 700 mA load.

In prior art the output voltage of a battery is often used to monitor the charge status of a battery. This is not well-suited to applications in which different modes of current loading are required. Because the voltage at the battery terminals can vary significantly among the various loads, selecting a single point under load at which e.g. to shut down would not be an efficient use of the battery, as certain applications would be closed prematurely.

U.S. Pat. No. 6,291,966 to Wendelrup et al. describes a battery system and method for supplying operating power during battery operation of a battery power receiving device. The battery system and method further includes a battery information circuit carried as a unit together with the battery means for assembly with the battery power receiving device. The battery information circuit includes memory cells and is capable of communicating information with the battery power receiving device.

U.S. Pat. No. 6,046,574 to Baranowski et al. discloses a mobile electronic device which can operate in multiple modes, each at a respective current load. Monitoring a battery in such a mobile device includes acquiring a sensed battery voltage during a particular operating mode and converting the sensed battery voltage to a scaled voltage for a known battery discharge curve having a well-defined turn-off voltage. The known battery discharge curve is preferably one for a full current load. The scaled voltage is then compared with the well-defined turn-off voltage to determine the amount of energy remaining in the battery.

U.S. Pat. No. 5,870,685 to Flynn shows a method and apparatus for controlling the operations of a battery-powered mobile station based on the capacity of its battery. The mobile station monitors the capacity of its battery to determine whether it has fallen below any one of a plurality of threshold capacity values. Different mobile stations operations are progressively disabled as the capacity of the battery falls below certain predetermined threshold levels. For a smart battery according to the Duracell/Intel specification a microprocessor can obtain the present capacity value directly from the smart battery. For a semi-smart battery, however, the battery may be initially conditioned, that is, completely discharged and then fully recharged from an external power source using, for example, a current shunt from the external power source to a current meter in the mobile station.

SUMMARY OF THE INVENTION

A principal object of the present invention is to provide a most accurate battery charge monitor continuously checking on the charge status of a battery of a battery driven appliance.

A further object of the present invention is to achieve a low current consumption of a said battery charge monitor.

In accordance with the objects of this invention, a circuit with the ability to monitor most accurately the charge/discharge status of a battery of a battery powered device is achieved. The circuit comprises, first, a battery to power said device, measuring means to measure the currents charging and discharging said battery, an external power supply, a reference voltage, mode setting means to set a specific mode of said mobile device, an input switching unit providing the input for the following components of the circuit and integrating means to integrate said currents charging/discharging the battery.

Furthermore the circuit comprises analog-to-digital converting means to enable digital processing within the monitor, compensating means to compensate the offset of said integrating means and up/down counting means representing the digital magnitude of the changes of the charge of said battery.

Furthermore the circuit comprises switching means having an input and an output wherein the input is the output of said up-and-down counting means and the output is fed to an accumulating means to accumulate said charge/discharge currents according to the sign of said up-and-down counting means, an accumulating means representing the absolute charge status of the battery and providing output to a controller unit managing the required actions related to said charge/discharge status of the battery and logic switching means controlling the timing of said input switching unit and of said integrating means integrating said currents charging/discharging said battery.

Furthermore in accordance with the objects of this invention, a circuit with the ability to monitor most accurately the charge/discharge status of a battery of a battery powered device is achieved.

The circuit comprises, first, a battery to power said device, measuring means to measure the currents charging and discharging said battery, an external power supply, a reference voltage, mode setting means to set a specific mode of said mobile device and switching means having an input and an output. Said input is a voltage representing said charge and discharge currents, said reference voltage, said indicator of a specific mode and a signal from a logic switching means controlling the timing of said input switching means and the output is switched to integrating means to integrate said charge/discharge currents over time to get the actual charge as an integral of currents.

Furthermore the circuit comprises said integrating means to integrate said charge/discharge currents having an input and an output wherein the input is a signal from a logic switching means controlling the timing of said means of integrating said charge/discharge currents and alternately, controlled by said logic switching means, said voltage representing said charge and discharge currents and, as output of additional compensating means to compensate the offset, a voltage representing the offset of said integrating means to integrate said charge/discharge currents or the input is shorted to convert the offset of said integrating means and the output is either the integral over time of the said measured charge/discharge currents or the converted offset during the time period while the input is shorted.

Furthermore the circuit comprises analog-to-digital converting means having an input and an output wherein the input is the output of said integrating means to integrate the charge/discharge currents and the output of said analog-to digital converting means is the digital magnitude of the integral of the charge/discharge currents or alternatively the digital magnitude of the offset of said integrating means to integrate the charge/discharge currents.

Furthermore the circuit comprises compensating means to compensate the offset of said integrating means, up/down counting means representing the digital magnitude of the changes of the charge of said battery having an input and an output. Said input is the output of said analog-to-digital converting means and said output of said up-and-down counting means is fed to a switching means which is forwarding said result of up-and-down counting to accumulating means to accumulate either a charge or a discharge accumulator according to the sign of the up-and-down counter.

Furthermore said switching means have an input and an output wherein the input is the output of said up-and-down counting means and the output is fed to said accumulating means to accumulate either a charge or a discharge accumulator according to the sign of the up-and-down counter.

Furthermore the circuit comprises an accumulating means representing the absolute charge status of the battery having an input and an output wherein the input is the output of said up/down counting means, a power supply voltage and the output is the input to a control unit representing the actual status of the charge and the discharge currents of said battery.

Finally the circuit comprises a logic switching means controlling the timing of said input switching unit and said integrating means to integrate said charge/discharge currents and of latching data in said accumulating means at the end of each time frame and a frame counting means defining time frames of a defined number of clock signals having an input and an output wherein the input is a clock signal and the output is an input of said logic switching means.

Also in accordance with the objects of this invention a method to monitor the charge status of a battery of a battery powered device is introduced. Said method comprises providing a battery to power said device, measuring means to measure the currents charging and discharging said battery, an external power supply, a reference voltage, an input switching unit, integrating means to integrate said charge/discharge currents, analog-to digital converting means, compensating means to compensate the offset of said integrating means and accumulating means to accumulate said digitized results of the integration of the currents representing the current status of the charge and discharge currents of said battery. The first step is to start with a defined charge status of said battery. The next step is to measure the charge/discharge currents followed by an integration of said charge/discharge currents while the offset of the integrator is compensated. Said digitized values representing the magnitude of the charge digitized are accumulated and finally the values of the charge/discharge currents according to the related accumulator values are signalled to a controlling unit.

Also in accordance with the objects of this invention a method to monitor the charge status of a battery of a battery powered device is introduced. Said method comprises providing a battery to power said device, measuring means to measure the currents charging and discharging said battery, an external power supply, a reference voltage, mode setting means to set a specific mode of said mobile device, an input switching unit, integrating means to integrate said charge/discharge currents, analog-to digital converting means, compensating means to compensate the offset of said integrating means, up/down counting means, means to forward said result of up/down counting to an accumulating means, an accumulating means representing the current status of the charge and discharge currents of said battery, and logic switching means controlling the timing of said input switching unit and said integrating means to integrate said charge/discharge currents and latching of data in said accumulating means at the end of each time frame and defining time frames of a defined number of clock signals. The first step is to start with a defined charge status of said battery. The mode of operation of the mobile device is defined influencing the dimension of power consumption and the resolution of the battery charge monitor. The charge/discharge currents are being measured. Said charge/discharge currents are being integrated while the offset of the integrator is being compensated the same time. The integrated values of previous step are converted from analog to digital values. The digitized values from the previous step are incremented according to sign of charge/discharge current in an up/down counter. The magnitude of the charge digitized in said up-down counter is added to either a charge accumulator or to the discharge accumulator. Overflows from the charge/discharge accumulators are used to clock additional registers and the signal values of the charge/discharge currents are signalled according to the related accumulator values to a controlling unit.

BRIEF DESCRIPTION OF THE DRAWINGS

In the accompanying drawings forming a material part of this description, there is shown.

DESCRIPTION OF THE PREFERRED EMBODIMENTS

The preferred embodiment disclose a novel circuit and method to monitor continuously and accurately the charge status of a battery of a battery powered appliance., e.g. a mobile phone.

The energy available in a battery is signified by the charge in a battery. The charge is measured in Coulomb. The actual charge status Q of a battery is controlled by the integral over time of the currents I charging and discharging the battery over time. The charge Q amounts to $$Q = \int I dt$$

The invention is monitoring directly the actual charge status of the battery by using integrating means to integrate over time the currents charging and discharging the battery while any inaccuracies caused by offset are compensated by the design of the circuit.

The internal resistance of the battery does not affect the Coulomb counting function but in a preferred embodiment the battery voltage is measured at low discharge currents during standby and at a high discharge current mode and the difference is used by a processor to determine the internal resistance of the battery which in turn is used to determine shutdown criteria.

Figure 2:
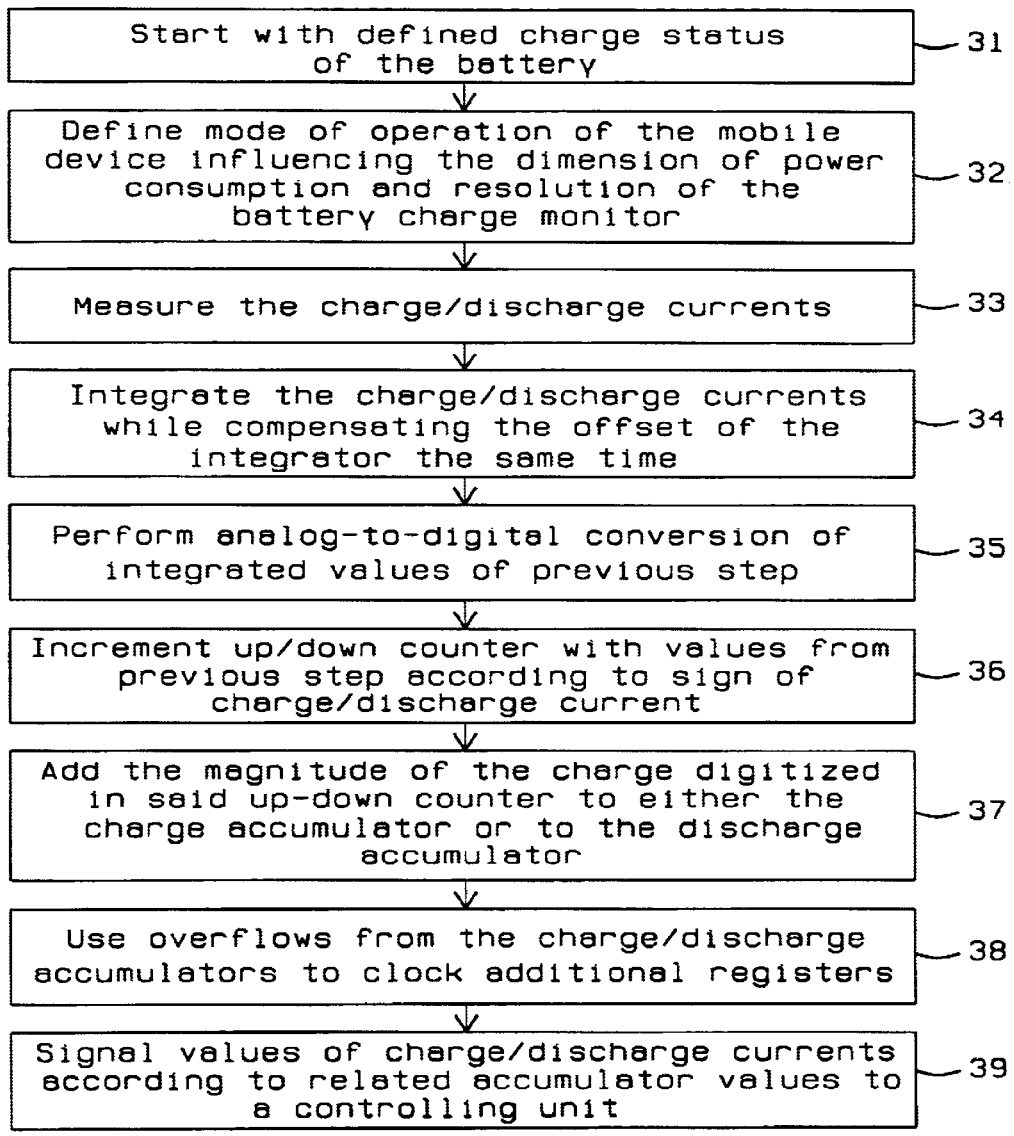
FIG. 2 shows a method how the charge of a battery is monitored

A method how to monitor the charge status of a battery is illustrated in FIG. 2. Step 31 shows a defined starting point, e.g. a fully charged battery. Preferably when installing a new battery all registers are reset and a fully charged state is assumed. A specific battery type has a predetermined full charge number entered in a register.

In step 32 the mode of operation of the mobile device, e.g. SLEEP mode of a mobile phone can be defined. Specific modes of operations are causing different order of magnitudes of the power consumption and are considered to define the resolution of the battery charge/discharge monitor. Said mode of operation has impact to e.g. the size of the shunt measuring the charge/discharge current in the following step 33 and to the number of bits in the up/down counter in step 36. Step 33 illustrates the measurement of the charge and discharge currents. The next step 34 comprises the integration over time of the charge/discharge currents measured in the previous step to define the change of the magnitude of the charge of the battery while compensating a potential offset of the integrator. The offset is varying at a slower speed as the charge/discharge current. The following step 35 is comprising an analog-to-digital conversion of the integrated values of the charge/discharge currents. In step 36 an up/down counter is incremented by the digitized values of the previous step each clock cycle according to the sign of the charge/discharge current. In step 37 the magnitude of the charge digitized in the up/down counter of the previous step is added to either a charge accumulator or a discharge accumulator according to the sign bit. In step 38 overflows from said accumulators are used to clock additional registers In step 39 the values of the charge/discharge accumulators representing the charge status of the battery via the integrals of the charge/discharge currents are signalled as input to a control unit which is handling the necessary actions according to the actual charge status of the battery.

Said control unit indicates to the user that charging is required and can control the charge profile once the user has initiated a charge cycle.

Figure 1:
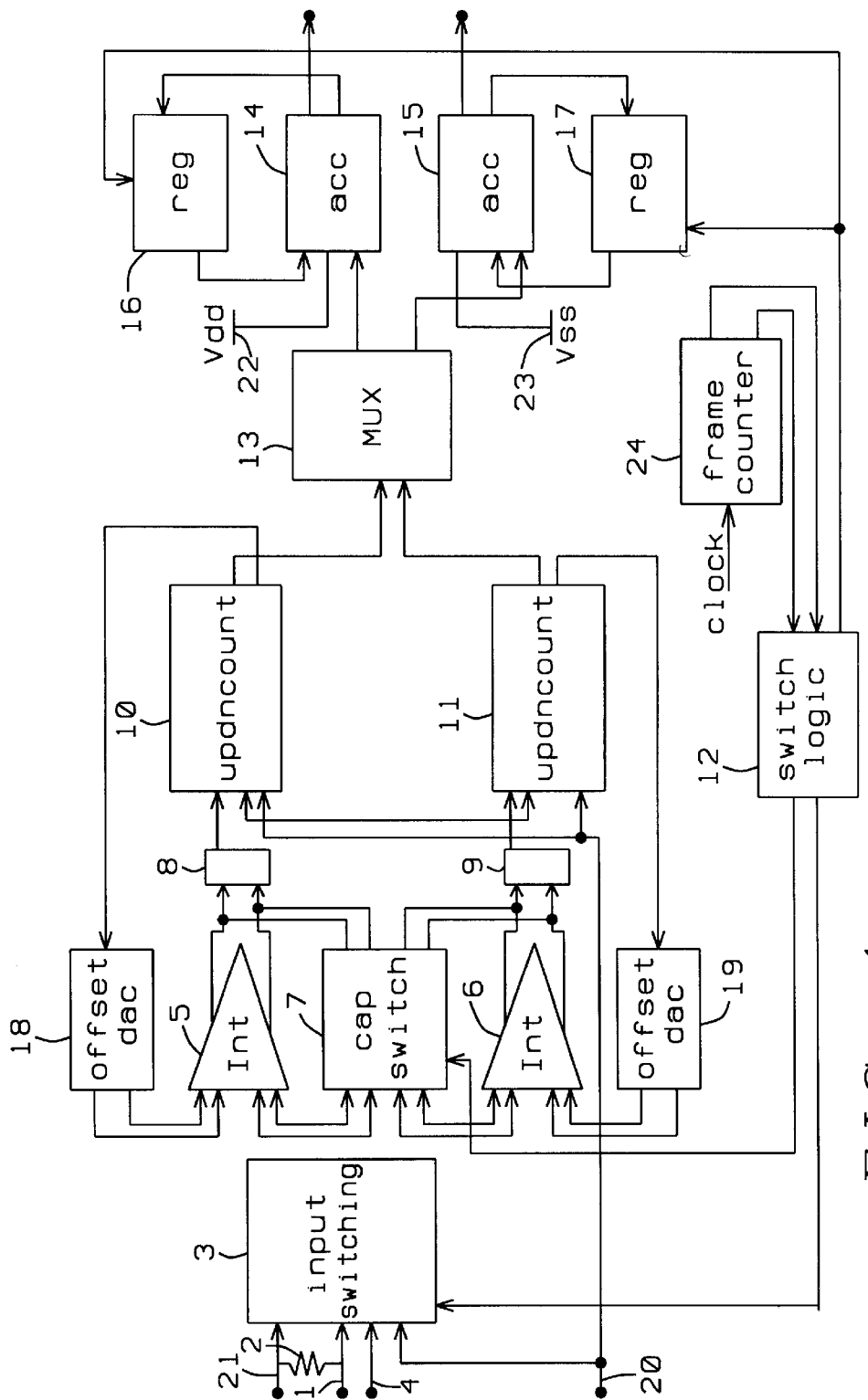
FIG. 1 illustrates a schematic illustration of a preferred embodiment of a circuit monitoring the charge of a battery

FIG. 1 shows a schematic illustration of a preferred embodiment of the circuit invented. The voltage across a sense resistor 2 is representing the charge/discharge current between a battery terminal 1 and the supply port 21. The circuit uses a pair of two differential integrators 5 and 6 comprising a common integrator capacitor switching unit 7, containing a set of switches and capacitors used for the integration, to continuously measure the charge and discharge of the battery 1. A switch logic unit 12 is used to control the input switching unit 3 the capacity switching unit 7 and the latching of data at registers 16 and 17 at the end of each frame. In a preferred embodiment a frame contains 4096 clock cycles. A frame counter 24 is controlling said clock cycles and is hereby controlling said switch logic unit 12.

The measured charge is converted to a digital result and stored in a register. The charge/discharge currents of the battery are flowing to or from the battery 1 via a sense resistor 2 to the charge/discharge port 21. The voltage across said sense resistor 2 is indicating the direction of said charge/discharge current and the magnitude of said current. One integrator converts the voltage across said sense resistor 2 while the second integrator performs a similar conversion with its input shorted so that the resultant digital word represents the input offset of the second integrator. The integrators are then swapped by the input switching unit 3 so that the second integrator converts the sense resistor 2 voltage and the first integrator performs a conversion of its input offset. To achieve an analog-to-digital conversion a reference current 4 and the input current are integrated over each clock cycle, at the end of each cycle the sign of the integrator output is latched and determines the sign of the reference current to be used for the next clock cycle so as to reduce the charge on the integrating capacitors in the integrator capacitor switching unit 7. The input of the pair of comparators 8 and 9 is the output from the pair of integrators 5+7 respective 6+7 and a clock signal. Said pair of differential integrators 5 and 6 are sharing the same capacitor switching unit 7. The output of said comparators 8 and 9 is the input of a pair of up/down counters 10 and 11. Said pair of up/down counters 10 and 11 is incremented each clock cycle according to the sign of the reference current. Each conversion takes 4096 clock cycles after which the roles of the integrators are swapped but to preserve the input integrated charge the integration capacitors in the integrator capacitor switching unit 7 are swapped as well, this occurs on a clock edge so that the integration of the input is continuous. After each conversion the magnitude of the charge digitized in the up-down counters 10 and 11 is added via a multiplexer 13 to either a charge accumulator 14 or a discharge accumulator 15 according to the sign bit. Said charge accumulator 14 has the power supply VDD 22 and said discharge accumulator has got the power supply VSS 23. Overflows from said accumulators 14 or 15 are used to clock additional registers 16 and 17 of any required length. In a specific embodiment the full scale charge/discharge current is scaled to a 1.6 A and with a 32 Khz clock overflows from the accumulators occur for each 0.210 Coulomb. Said 0.210 Coulomb is the minimum increment of the charge/discharge of the battery in a specific embodiment or in other words, there is one output pulse per 0.210 Coulomb.

For the low current range, e.g. SLEEP or STANDBY mode, a SLEEP sign 20 is set to accommodate the resolution of the system to said specific mode. The control unit of said battery powered device knows when said device is in low current mode or high current mode and is setting the related signal. In an specific embodiment the input resistors are reduced in said low current mode by a factor of 16× and the up-down counter is extended by 4 extra bits at the least-significant-bit (lsb) end to extend the resolution to 49 $\mu A$ per lsb.

The input offset is initially reduced to less than 1.5 mV to avoid the input offset compromising the dynamic range of the input conversion. This offset null is performed with the addition of an offset digital-to-analog conversion (DAC) and stop logic 18 and 19 but using the same comparators 8 and 9 and the same up-down counters 10 and 11 as for the conversion of the charge/discharge currents. The offset null can take up to 16 clock cycles to complete while a complete input voltage conversion requires 4096 cycles. The offset count is subtracted from the input voltage count to compensate for the offset. In order to limit the error of the offset null period the initial input offset null is only performed once for every 16 offset conversions performed by that integrator.

The accuracy of the input signal conversion is only constrained by the accuracy of the offset compensation. The offset can be expected to vary in random fashion and in response to temperature variations as a result of both amplifier offset and switch leakage current, these variations occur relatively slowly but they impose a maximum period over which the accuracy of a single offset conversion applies. The offset conversion is discontinuous so the offset resolution is defined by the number of bits used for the conversion. 12 bits in a specific embodiment, but since the least-significant-bit (lsb) of the up/down counter is always zero after an even number of clocks this is actually an 11 bit resolution, so the offset compensation relies on the offset staying constant over 230 milliseconds. This is the time required for one offset conversion and one input conversion.

The advantages of the present invention may now be summarized. The present invention provides a most accurate method and circuit to monitor the charge of a battery of a mobile device. The charge of the battery is monitored directly via the integrated charge and discharge currents and not as often in prior art in an indirect way using the output voltage of the battery.

While the invention has been particularly shown and described with reference to the preferred embodiments thereof., it will be understood by those skilled in the art that various changes in form and details may be made without departing from the spirit and scope of the invention.

What is claimed is:

1. A circuit able to monitor the charge of a battery of a battery powered device comprising:
    a rechargeable battery to power said device;
    measuring means to measure the currents charging and discharging said battery;
    an external power supply;
    a reference voltage;
    mode setting means to set a specific mode of said mobile device;
    an input switching unit providing the input for the following components of the circuit;
    integrating means to integrate said currents charging/discharging the battery;
    analog-to-digital converting means to enable digital processing within the monitoring circuit;
    compensating means to compensate the offset of said integrating means;
    up/down counting means representing the digital magnitude of the changes of the charge of said battery;
    a switching means having an input and an output wherein the input is the output of said up-and-down counting means and the output is fed to an accumulating means of a charge/discharge accumulator according to the sign of said up-and-down counter;
    the accumulating means representing the absolute charge status of the battery and providing output to a controller unit managing the required actions related to the charge/discharge status of the battery; and
    a logic switching means controlling the timing of said input switching unit and of said means of integrating said currents charging/discharging said battery.

2. The circuit of claim 1 wherein said measuring to measure the currents charging and discharging the battery is a sense resistor located between the battery output voltage and a power supply source.

3. The circuit of claim 1 wherein said mode setting means to set a specific mode of said mobile device is a signal setting a low current (sleep) mode to reduce the resolution of the battery charge/discharge monitor.

4. The circuit of claim 1 wherein said integrating means to integrate said charge and discharge currents of the battery is a pair of differential integrators and additionally an integrator switching unit comprising capacitors for the integration and switches to assign said capacitors to said differential integrators.

5. The circuit of claim 1 wherein said analog-to-digital converting means is a pair of comparators digitizing the integrated values of the charge/discharge currents.

6. The circuit of claim 1 wherein said compensating means to compensate the offset of said pair of differential integrators is a pair of digital-to-analog conversion units having an input and an output wherein the input is the up-and-down count of the offset converted by said integrator and the output is the input of said differential integrator which is integrating said charge/discharge current of said battery at this point of time.

7. The circuit of claim 1 wherein said accumulating means to accumulate the absolute charge of the battery is a pair of accumulators, wherein one of the accumulators is accumulating the charge status and the other one is accumulating the discharge status of said battery, having an input and an output wherein the input is the output of said switching unit and an external power supply and the output is the input of a control unit controlling the necessary actions according to the charge status of the battery if required.

8. The circuit of claim 7 wherein said output to a control unit is an pulse for each defined increment of the charge/discharge change of said battery.

9. The circuit of claim 1 wherein said battery powered device is a mobile phone.

10. The circuit of claim 1 wherein said battery powered device is a computing device.

11. A circuit able to monitor the charge of a battery of a battery powered device comprising:
    a rechargeable battery to power said device;
    a measuring means to measure the currents charging and discharging said battery;
    an external power supply;
    a reference voltage;
    a mode setting means to set a specific mode of said mobile device;
    switching means having an input and an output wherein the input is a voltage representing said charge and discharge current, said reference voltage, said indicator of a specific mode and a signal from a switch logic controlling the timing of said input switching unit and the output is switched to integrating means of said charge/discharge currents over time to get the actual charge as an integral of currents;
    said integrating means said charge/discharge currents having an input and an output wherein the input is a signal from a switch logic unit controlling the timing of said integrating means said charge/discharge currents and alternately, controlled by said switch logic signal, said voltage representing said charge and discharge currents and, as output of compensating means to compensate the offset, a voltage representing the offset of said integrating means or the input is shorted to convert the offset of said integrating means and the output is either the integral over time of the said measured charge/discharge currents or the converted offset during the time period while the input is shorted;

an analog-to-digital converting means having an input and an output wherein the input is the output of said integrating means to integrate the charge/discharge currents and the output of said analog-to-digital converting means is the digital magnitude of the integral of the charge/discharge currents or alternatively the digital magnitude of the offset of said integrating means to integrate the charge/discharge currents;

a compensating means to compensate the offset of said integrating means;

an up/down counting means representing the digital magnitude of the changes of the charge of said battery having an input and an output wherein the input is the output of said analog-to-digital converting means and the output of said up-and-down counting means is fed to a switching means which is forwarding said result of up-and-down counting to accumulating means to accumulate either a charge or a discharge accumulator according to the sign of the up-and-down counter;

a switching means having an input and an output wherein the input is the output of said up-and-down counting means and the output is fed to said accumulating means to accumulate either a charge or a discharge accumulator according to the sign of the up-and-down counter;

the accumulating means representing the absolute charge status of the battery having an input and an output wherein the input is the output of said up/down counting means, a power supply voltage and the output is the input to a control unit managing the required actions related to the charge/discharge status of said battery;

a logic switching means controlling the timing of said input switching unit and said integrating means to integrate said charge/discharge currents and of latching of data in said accumulating means at the end of each time frame; and a frame counting means defining time frames of a defined number of clock signals having and input and an output wherein the input is a clock signal and the output is an input of said means of switch logic.

12. The circuit of claim 11 wherein said measuring means to measure the currents charging and discharging the battery is a sense resistor located between the battery output voltage and a power supply source.

13. The circuit of claim 11 wherein said mode setting means to set a specific mode of said mobile device is a signal setting a low current (sleep) mode to reduce the resolution of the battery charge/discharge monitor.

14. The circuit of claim 11 wherein said integrating means to integrate said charge and discharge currents of the battery is a pair of differential integrators and additionally an integrator switching unit comprising capacitors for the integration and switches to assign said capacitors to said differential integrators.

15. The circuit of claim 11 wherein said analog-to-digital converting means is a pair of comparators digitizing the integrated values of the charge/discharge currents.

16. The circuit of claim 11 wherein said compensating means to compensate the offset of said pair of differential integrators is a pair of digital-to-analog conversion units having an input and an output wherein the input is the up-and-down count of the offset converted by said integrator and the output is the input of said differential integrator which is integrating said charge/discharge current of said battery at this point of time.

17. The circuit of claim 11 wherein said accumulating means to accumulate the absolute charge of the battery is a pair of accumulators, wherein one of the accumulators is accumulating the charge status and the other one is accumulating the discharge status of said battery, having an input and an output wherein the input is the output of said switching unit and an external power supply and the output is the input of a control unit controlling the necessary actions according to the charge status of the battery if required.

18. The circuit of claim 17 wherein said output to a control unit is an pulse for each defined increment of the charge/discharge change of said battery.

19. The circuit of claim 17 wherein overflows from said pair of accumulators are used to clock additional registers.

20. The circuit of claim 11 wherein said battery powered device is a mobile phone.

21. The circuit of claim 11 wherein said battery powered device is a computing device.

22. The circuit of claim 11 wherein a time frame of 4096 clock signals is used.

23. A method of monitoring the charge/discharge status of a battery of a battery powered device comprising:

providing a rechargeable battery to power said device, measuring means to measure the currents charging and discharging said battery, an external power supply, a reference voltage, an input switching unit, integrating means to integrate said charge/discharge currents, analog-to-digital converting means, compensating means to compensate the offset of said integrating means to integrate the charge/discharge currents, accumulating means to accumulate said digitized results of the integration of the currents representing the current status of the charge and discharge currents of said battery;

start with a defined charge status of said battery;

measure the charge/discharge currents;

integrate the charge/discharge currents while compensating the offset of the integrator;

add the magnitude of the charge digitized to a accumulator; and signal values of the charge/discharge currents according to the related accumulator values to a controlling unit.

24. The method of claim 23 wherein said defined charge status of said battery to start is a fully charged battery status.

25. The method of claim 23 wherein said measuring means to measure the currents charging/discharging said battery is a sense resistor located between the battery output port and a power supply source.

26. The method of claim 23 wherein said integrating means to integrate said charge and discharge currents of the battery is a pair of differential integrators and additionally an integrator switching unit comprising capacitors for the integration and switches to assign said capacitors to said differential integrators.

27. The method of claim 23 wherein said analog-to-digital converting means is a pair of comparators digitizing the integrated values of the charge/discharge currents.

28. The method of claim 23 wherein said compensating means to compensate the offset of said integrating means to integrate the charge/discharge currents provides a pair of digital-to-analog conversion units and said offset is measured and digitized and said offset count is subtracted from the input voltage count after it has been converted back to analog to compensate for the offset.

29. The method of claim 23 wherein said accumulating means to accumulate the absolute charge of the battery is a pair of accumulators wherein one of the accumulators is accumulating the charge status and the other one is accumulating the discharge status of said battery, having an input and an output wherein the input are the digitized values of the integrated charge/discharge currents and an external power supply and the output is the input of a control unit controlling the necessary actions according to the charge status of the battery if required.

30. The method of claim 23 wherein said battery powered device is a mobile phone.

31. The method of claim 23 wherein said battery powered device is a computing device.

32. A method of monitoring the charge/discharge status of a battery of a battery powered device comprising:

providing a rechargeable battery to power said device, measuring means to measure the currents charging and discharging said battery, an external power supply, a reference voltage, mode setting means to set a specific mode of said mobile device, an input switching unit, integrating means to integrate said charge/discharge currents, analog-to-digital converting means, compensating means to compensate the offset of said integrating means to integrate the charge/discharge currents, up/down counting means, forwarding means to forward said result of up/down counting to an accumulating means, an accumulating means representing the current status of the charge and discharge currents of said battery, and logic switching means controlling the timing of said input switching unit and said integrating means and of latching of data in said accumulating means at the end of each time frame and defining time frames of a defined number of clock signals; start with a defined charge status of said battery;

define mode of operation of the mobile device influencing the dimension of power consumption and resolution of the battery charge monitor;

measure the charge/discharge currents;

integrate the charge/discharge currents while compensating the offset of the integrator the same time;

perform analog-to-digital conversion of integrated values of previous step;

increment up/down counter with values from previous step according to sign of charge/discharge current;

add the magnitude of the charge digitized in said up-down counter to either the charge accumulator or to the discharge accumulator;

use overflows from the charge/discharge accumulators to clock additional registers; and signal values of the charge/discharge currents according to the related accumulator values to a controlling unit.

33. The method of claim 32 wherein said measuring means to measure the currents charging/discharging said battery is a sense resistor located between the battery output port and a power supply source.

34. The method of claim 32 wherein said modes of operation activated is either a sleep mode having a low current consumption and a high resolution of the monitor or a normal mode with a lower resolution.

35. The method of claim 32 wherein said integrating means to integrate said charge and discharge currents of the battery is a pair of differential integrators and additionally an integrator switching unit comprising capacitors for the integration and switches to assign said capacitors to said differential integrators.

36. The method of claim 32 wherein said analog-to-digital converting means is a pair of comparators digitizing the integrated values of the charge/discharge currents.

37. The method of claim 32 wherein said compensating means to compensate the offset of said integrating means to integrate the charge/discharge currents provides a pair of digital-to-analog conversion units and said offset is measured and digitized and said offset count is subtracted from the input voltage count after it has been converted back to analog to compensate for the offset.

38. The method of claim 32 wherein said forwarding means to forward said result of up/down counting to an accumulating means is a multiplexer.

39. The method of claim 32 wherein said accumulating means to accumulate the absolute charge of the battery is a pair of accumulators, wherein one of the accumulators is accumulating the charge status and the other one is accumulating the discharge status of said battery, having an input and an output wherein the input is the output of said switching unit and an external power supply and the output is the input of a control unit controlling the necessary actions according to the charge status of the battery if required.

40. The method of claim 32 wherein said battery powered device is a mobile phone.

41. The method of claim 32 wherein said battery powered device is a computing device.

* * * * *

UNITED STATES PATENT AND TRADEMARK OFFICE
CERTIFICATE OF CORRECTION

PATENT NO. : 6,661,204 B2
APPLICATION NO. : 10/094453
DATED : December 9, 2003
INVENTOR(S) : John Malcolm It is certified that error appears in the above-identified patent and that said Letters Patent is hereby corrected as shown below:

Title page, in the Foreign Application Priority Data (30), add -- March 5, 2002 (EP) 02392001.0 --.

Signed and Sealed this
Twenty-fourth Day of September, 2013

Teresa Stanek Rea
*Deputy Director of the United States Patent and Trademark Office*